US005737268A

United States Patent [19]
Pascucci

[11] Patent Number: 5,737,268
[45] Date of Patent: Apr. 7, 1998

[54] MODULATED SLOPE SIGNAL GENERATION CIRCUIT, PARTICULARLY FOR LATCH DATA SENSING ARRANGEMENTS

[75] Inventor: Luigi Pascucci, Sesto San Giovanni, Italy

[73] Assignee: SGS-Thomson Microelectronics S.r.l., Agrate Brianza, Italy

[21] Appl. No.: 684,431

[22] Filed: Jul. 19, 1996

[30] Foreign Application Priority Data

Jul. 28, 1995 [EP] European Pat. Off. ............... 95830336

[51] Int. Cl.$^6$ ........................................................ G11C 7/00
[52] U.S. Cl. ............................ 365/189.05; 365/189.09; 365/204; 365/203; 365/205
[58] Field of Search .................... 365/189.05, 189.09, 365/204, 203, 205

[56] References Cited

U.S. PATENT DOCUMENTS

| | | | |
|---|---|---|---|
| 3,848,236 | 11/1974 | Troutman | 340/173 R |
| 4,669,063 | 5/1987 | Kirsch | 365/189 |
| 4,811,290 | 3/1989 | Watanabe | 365/149 |
| 5,541,881 | 7/1996 | Miller | 365/189.05 |
| 5,598,376 | 1/1997 | Merritt et al. | 365/204 |

FOREIGN PATENT DOCUMENTS

A-0 205 294  12/1986  European Pat. Off. .

OTHER PUBLICATIONS

European Search Report from European Patent Application No. 95830336.4, filed Jul. 28, 1995.

*Primary Examiner*—David C. Nelms
*Assistant Examiner*—Huan Hoang
*Attorney, Agent, or Firm*—Wolf, Greenfield & Sacks, P.C.; James H. Morris

[57] ABSTRACT

A latch arrangement, having a load, receives an equalization signal to control the timing of data sensing and data capture. The slope of the equalization signal is modulated so that it has two slopes: a less steep one which permits evaluation of a datum with appropriate caution, and a much steeper slope, which occurs at the end of reliable evaluation, to capture the datum and store it. The equalization signal is generated by first presetting the equalization signal to a first value. Thereafter a change in the equalization signal from the first value to a second value is initiated. After initiating the change in the equalization signal, the equalization signal is slowly discharged at a first slope. A ratio between a current generated in a generic matrix cell applied to the load of the latch arrangement and a reference current is evaluated. When the evaluated ratio reaches a desired level, the equalization signal is quickly discharged to the second value at a second slope.

19 Claims, 2 Drawing Sheets

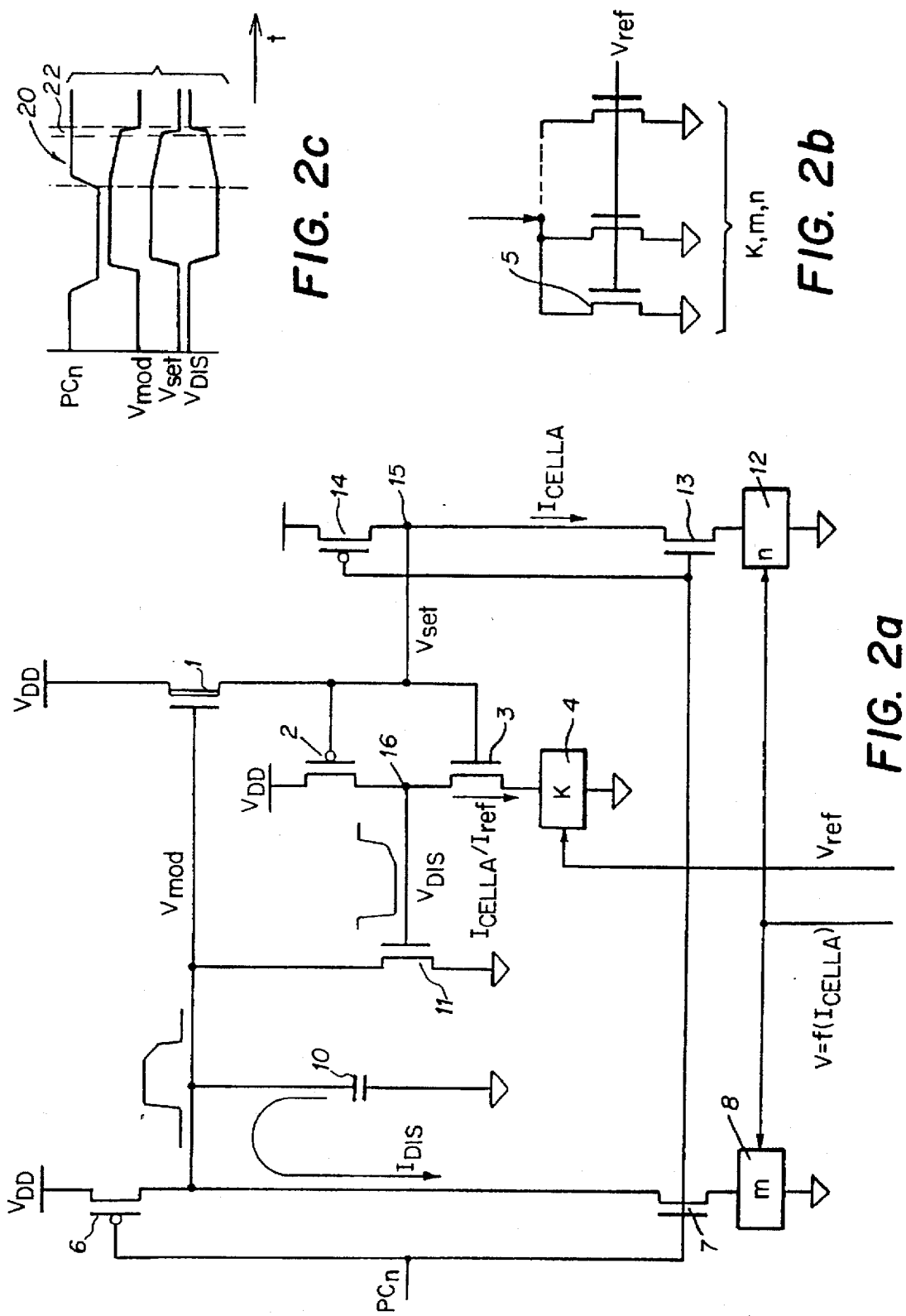

MODULATED SLOPE SIGNAL GENERATION CIRCUIT, PARTICULARLY FOR LATCH DATA SENSING ARRANGEMENTS

BACKGROUND OF THE INVENTION

1. Field of the Invention

The present invention relates to a modulated slope signal generation circuit, particularly adapted for applications in circuits using latch sensing arrangements.

2. Discussion of the Related Art

It is important to achieve two basic goals in circuits using latch arrangements for data sensing, i.e., for capturing and storing data. FIG. 1a is a diagram of a latch sensing arrangement with two nodes M and R. The result to be obtained, starting from a substantial equalization of the two nodes M and R of the latch, is the generation, with an appropriate timing, of a small signal that can be sensed reliably and stored correctly.

FIG. 1b is a graph, as a function of time, of the voltage of the signal to be obtained on the two branches of the latch that correspond to nodes M and R. This chart shows that the signal created after the equalization step, which corresponds to the straight portion of the curve, is a weak signal, and that the divergence that is obtained, which corresponds to the different voltage levels on the two branches, is initially small and then increases. In other words, the voltage level produced on each of the two branches must be different enough to determine a binary representation that defines a datum. It is therefore necessary to create a signal having an initially low level but which can be sensed and stored correctly, and then reaches a high voltage level, which corresponds to a logic 1, on one branch, and a low voltage level, which corresponds to a logic zero, on the other branch.

The drawbacks observed with latch arrangements of this kind relate to the choice of the timings with which data reading and storage are to be performed. Since two different currents are produced in the two branches of the latch, which are initially intentionally shorted, and since this difference is highly variable because there are weak signals and strong signals and there are matrix cells, which constitute the load of the latch, having high conductivity and low conductivity, it is not possible to be certain of the reading. Accordingly, it is necessary to read or "capture" the datum in a controlled and therefore slow manner, but not too slowly, in order to avoid increasing the reading times excessively.

If instead the datum is captured too quickly, there is the drawback that a capacitive effect, known as the Miller effect, is produced and is superimposed on the datum, surpassing it in terms of intensity and thus preventing its reliable capture.

As an alternative, it may also happen that if the datum capture times become too fast, not enough time is left to allow the currents present in the circuit to set the nodes adequately and therefore the latch arrangement does not operate correctly.

In all these cases, the result is an incorrect reading of the datum, its loss, or an inadequate utilization, in terms of time, of a latch sensing arrangement.

SUMMARY OF THE INVENTION

A general aim of the present invention is to provide an improved circuit to control data capture in a latch data sensing arrangement.

Accordingly, one object of the present invention is to provide a circuit for generating, with an appropriate timing, a modulated slope signal that can be sensed reliably and stored correctly.

Another object of the present invention is to provide a modulated slope signal generation circuit which can identify the instant in which the capture of a datum must be completed slowly but progressively.

Another object of the present invention is to provide a modulated slope signal generation circuit which reduces capacitive effects associated with the equalization line during the generation of the modulated slope signal.

Another object of the present invention is to provide a modulated slope signal generation circuit in which slope change occurs in reliably determined conditions and in a very short amount of time.

Another object of the present invention is to provide a modulated slope signal generation circuit in which the value of the modulated slope is linked to the value of the current of the cells.

Another object of the present invention is to provide a modulated slope signal generation circuit in which the timing is a function of the conductivity of the base cell of a cell matrix.

Another object of the present invention is to provide a modulated slope signal generation circuit that is capable of controlling the duration of the sloping part of the signal.

The foregoing and other objects and advantages of this invention are achieved by a circuit for generating an equalization signal with a modulated slope for a latch arrangement having an input for receiving the equalization signal on an equalization line and a load. The circuit includes a current follower branch having a generic matrix cell connected to the load of the latch arrangement and for following a current of the generic matrix cell. A current ratio evaluation branch is connected to the current follower branch for evaluating a ratio between the current and a reference current. A slow discharge branch, having an input for receiving a control signal having a first state for precharging the circuit and a second state for discharging the circuit, is connected to the equalization line and for slowly discharging the equalization line at a first slope after a change of the control signal from the first state to the second state. A fast discharge branch is connected to the equalization line for quickly discharging the equalization line at a second slope. The current ratio evaluation branch activates the fast discharge branch in response to the evaluated ratio.

In one embodiment of the invention, one or more mirroring transistors, having drain terminals connected to the current ratio evaluation branch, source terminals and gate terminals supplied by a voltage source, generates the reference current. The source terminals of the one or more mirroring transistors may be connected to ground.

The latch arrangement may include a first transistor having a source terminal, a gate terminal connected to the equalization line and a drain terminal connected to a supply voltage, and a second transistor having a gate terminal connected to the source terminal of the first transistor, a drain terminal connected to a supply voltage and a source terminal.

The current ratio evaluation branch may be implemented by a third transistor having a drain terminal connected to the source terminal of the second transistor, and a source terminal connected to the drain terminals of the one or more mirroring transistors which generate the reference current. In this embodiment, the second transistor may have a first polarity and the third transistor may have a second polarity.

The fast discharge branch may be implemented by a sixth transistor of a second polarity having a drain terminal connected to the equalization line, a source terminal connected to ground, and a gate terminal connected to the source terminal of the second transistor and the drain terminal of the third transistor.

An additional set of one or more mirroring transistors, having drain terminals connected to the slow discharge branch, source terminals and gate terminals supplied by a voltage source, may be used to set a current that is a function of the conductivity of the generic matrix cell, for controlling the first slope of the equalization signal. In this set of mirroring transistors, the source terminals of the one or more mirroring transistors may be connected to ground.

The slow discharge branch may be implemented by a fourth transistor having a source terminal, a drain terminal connected to a supply voltage and a gate terminal connected to receive the control signal, and a fifth transistor having a source terminal connected to the drain terminals of the one or more mirroring transistors, a drain terminal connected to the source terminal of the fourth transistor and a gate terminal connected to receive the control signal. The fourth transistor may have a first polarity, whereas the fifth transistor may have a second polarity. A capacitor may also be connected between the equalization line and ground in parallel with the slow discharge branch.

The generic matrix cell may be implemented by one or more mirroring transistors, having drain terminals connected to the load of the latch arrangement, source terminals and gate terminals supplied by a voltage source, for controlling ability of the current follower branch to follow the current of the generic matrix cell. The source terminals of the one or more mirroring transistors may be connected to ground.

The current follower branch may be implemented by a seventh transistor having a source terminal connected to the drain terminals of the one or more mirroring transistors, a gate terminal connected to receive the control signal, and a drain terminal, and an eighth transistor having a drain terminal connected to a supply voltage, a gate terminal connected to the gate terminal of the seventh transistor and a source terminal connected to the drain terminal of the seventh transistor. The eighth transistor may have a first polarity while the seventh transistor may have a second polarity.

Another aspect of the invention is a memory device including such a latch arrangement with a circuit for modulating the slope of an equalization signal applied to the latch arrangement.

Another aspect of the invention is the process performed by the circuit to generate the equalization with the modulated slope. In particular, this aspect of the invention includes steps of presetting the equalization signal to a first value and thereafter initiating a change in the equalization signal from the first value to a second value. After initiating the change in the equalization signal, the equalization signal is slowly discharged at a first slope. A ratio between a current generated in a generic matrix cell applied to the load of the latch arrangement and a reference current is evaluated. When the evaluated ratio reaches a desired level, the equalization signal is quickly discharged to the second value at a second slope.

BRIEF DESCRIPTION OF THE DRAWINGS

Further characteristics and advantages of the invention will become apparent from a preferred but not exclusive embodiment of the device according to the invention, illustrated only by way of non-limitative example in the accompanying drawings, wherein:

FIG. 1b is a plot of the signal present in the latch arrangement of FIG. 1a;

FIG. 2a is a diagram of the circuit according to the invention, applied to a latch sensing arrangement;

FIG. 2b is a diagram of a set of transistors comprising a cell;

FIG. 2c is a timing diagram showing the relationship of signals in the circuit of FIG. 2a in operation; and FIG. 3 is a plot of the voltages present at the various nodes of the circuit shown in FIG. 2a.

DETAILED DESCRIPTION

With reference to FIGS. 2a–c and 3, the circuit in this embodiment of the invention comprises a line for equalization of loads of a latch circuit.

A signal $V_{mod}$ is created on the equalization line and supplies the base terminal of a first equalization transistor 1 the drain terminal of which is connected to $V_{DD}$.

Figure 1A:
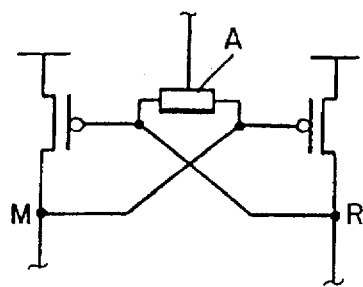
FIG. 1a is a diagram of a typical latch arrangement.
Figure 1B:
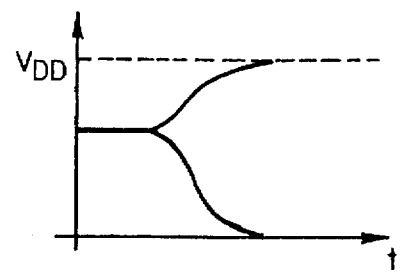

The latch arrangement of FIG. 2a is similar to that of FIG. 1a, and in particular the transistor on the right branch of the latch arrangement of FIG. 1 corresponds to a second transistor, designated by the reference numeral 2 in FIG. 2a, whereas the block designated by the letter A in FIG. 1a corresponds to the first equalization transistor, designated by the reference numeral 1 in FIG. 2a. In one embodiment, the transistor 1 is of the native type, whereas the transistor 2 is of the P-channel type.

The transistor provided on the left branch of the latch of FIG. 1a is not present, since that transistor would be always off, if present. Therefore, the left branch would be connected to the supply voltage $V_{DD}$.

In summary, in the equalization transistor 1 the drain terminal is connected to the supply voltage $V_{DD}$, the source terminal is connected to the gate terminal of the transistor 2, and the gate terminal is connected to a latch load equalization line, where an equalization signal $V_{mod}$ is present.

In the transistor 2, the drain terminal is also connected to the supply voltage $V_{DD}$ and the source terminal is connected to the drain terminal of a third current ratio evaluation transistor 3 that is part of a line for the evaluation of a current ratio. The gate terminal of the transistor 3 is also connected to the source terminal of the equalization transistor 1. In one embodiment, the transistor 3 is of the N-channel type.

The current ratio evaluation line comprising the transistor 3 is supplied by a first voltage source (not shown), which is external to the circuit and is capable of supplying a voltage $V_{ref}$ which stable enough to set a reference current $I_{ref}$ on the current ratio evaluation line.

The reference current, which is constant, is a function of the conductivity of a generic specimen matrix cell. The current ratio evaluation line has the purpose of evaluating the ratio between the current of a cell that is identical to the matrix cell and the reference current.

In particular, one or more mirroring transistors 5 comprise the cell that is identical to the matrix cell, and are generally designated by the reference numeral 4 in FIG. 2a. The cell 4 is associated with the current ratio evaluation line. The source terminal of each one of the transistors 5 is connected to ground (GND), and each one of the transistors 5 is constructed and arranged to determine the profile of the curve of the equalization signal $V_{mod}$.

The current set by the reference voltage $V_{ref}$ is therefore a function of the conductivity of the cell 4, which varies according to the number K of transistors 5 in the cell 4.

The circuit in FIG. 2a also has a branch which provides constant discharge of the equalization line $V_{mod}$. This branch comprises a fourth pre-charge transistor 6 of the P-channel type, in which the drain terminal is connected to the supply voltage $V_{DD}$, the gate terminal receives a control signal $PC_n$ originating outside the circuit, and the source terminal is connected to the drain terminal of a fifth pre-charge transistor 7 advantageously of the N-channel type. The gate terminal of the fifth transistor 7 also receives the control signal $PC_n$ in input.

A second voltage source (not shown) is external to the circuit generates a voltage V that is a function of the conductivity of a generic reference cell 8 comprised of one or more transistors, the number of which is "m". The source terminal of the transistor 7 is connected to the cell 8, which in turn is connected to ground by means of the source terminals of transistors in the cell 8. The cell 8 has a construction similar to that of cell 4, but with "m" transistors 5 rather than "k" transistors 5. The discharge of the slow constant discharge branch is a function of the conductivity of the generic reference cell 8, i.e., of the number "m" of transistors 5.

A capacitor 10 is parallel-connected to the slow discharge branch between the latch load equalization line where the signal $V_{mod}$ is present and ground.

The circuit in FIG. 2a also has a fast discharge branch parallel-connected to the capacitor 10 between the latch load equalization line and ground. This branch comprises a sixth transistor 11 in which the gate terminal is connected to the current ratio evaluation branch. The drain terminal of the sixth transistor 11 is connected to the equalization line $V_{mod}$ and its source terminal is connected to ground.

The circuit according to the invention furthermore comprises a branch that follows the current of a generic matrix cell 12 applied to one of the two loads of the latch circuit and constituted by a number "n" of transistors, of which the source terminals are connected to ground.

The current follower branch comprises a seventh transistor 13, which may be of the N-channel type, and an eighth transistor 14 of the P-channel type.

The source terminal of the eighth transistor 14 is connected to the drain terminal of the seventh transistor 13, whereas the gate terminal of the eighth transistor 14 is connected to the gate terminal of the seventh transistor 13, which in turn receives the signal $PC_n$.

Figure 3:
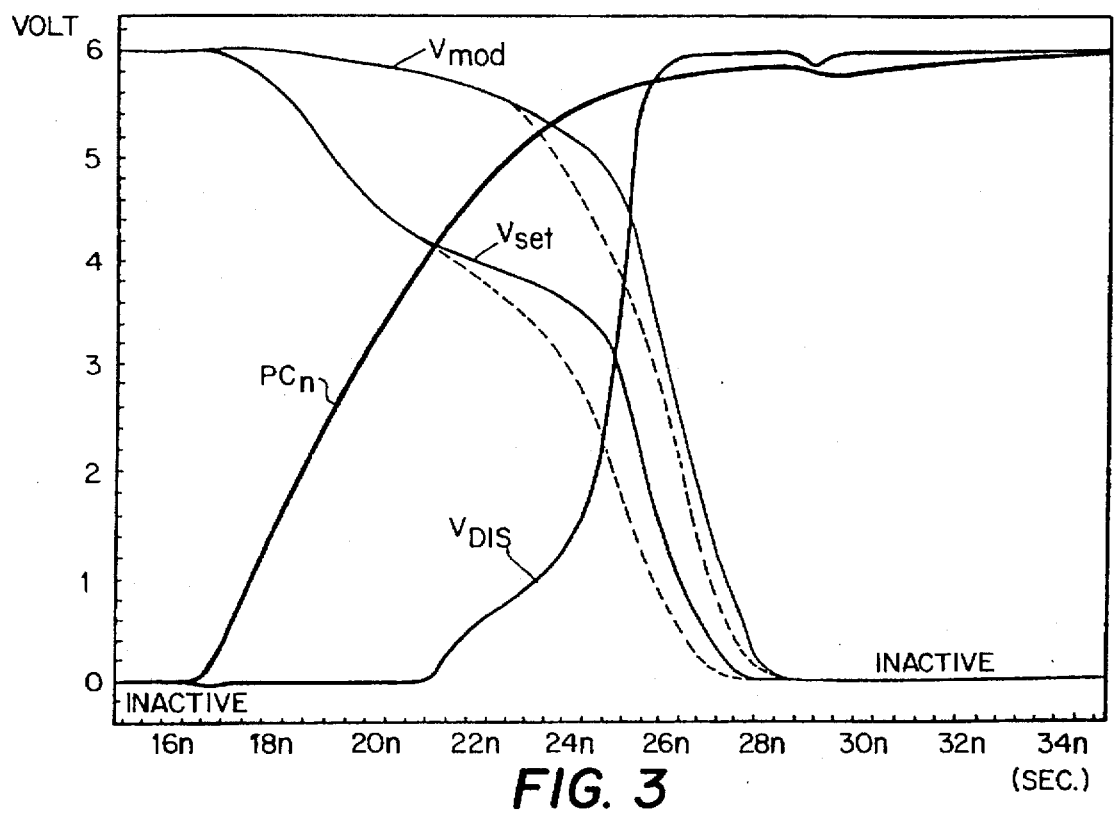

With reference to FIGS. 2a, 2c and 3, the operation of the circuit according to the invention is as follows.

In the initial inactive condition, the signal $PC_n$ is at the high level ($V_{DD}$), the equalization line $V_{mod}$ is at a low level, the node 15 on which the voltage $V_{set}$ is present is at the low level, the node 16 on which the voltage $V_{DIS}$ is present is at the high level, the voltage V set by the second voltage source is high, and the reference voltage $V_{ref}$ generated by the first source is low.

Upon activation, which is called a standby or pre-charge step, $PC_n$ switches to zero and the slow discharge branch, the current ratio branch, and the voltage follower branch are switched off.

At this time, the equalization line $V_{mod}$ is high, the voltage $V_{DIS}$ on the node 16 is low (GND), the voltage $V_{ref}$ generated by the first voltage source is constant, and the voltage V generated by the second voltage source is a function of the conductivity of the cell.

The voltage on the node 15 ($V_{set}$) of the voltage follower branch is $V_{DD}$, since the transistor 2 switches off.

The capacitor 10 is charged during this pre-charge step.

At the end of the pre-charge step, the signal $PC_n$ switches back to the high level ($V_{DD}$) and therefore the slow discharge branch, the current ratio branch, and the voltage follower branch are activated; the current ratio branch, however, is activated later than the other two branches.

The slow discharge branch discharges the capacitor 10, producing the first part of the slope of $V_{mod}$, i.e., the less steep part indicated at time period 20 in FIG. 2c. The capacitor 10 does not discharge quickly because a fast transistor is not provided on the slow discharge branch. The line $V_{mod}$ therefore discharges slowly, with a constant discharge current $I_{DIS}$; at the same time, the conductivity of the transistor 2 decreases. The slope of the line $V_{mod}$ is determined by the "m" transistors 5, which conduct a current that is a function of the conductivity of the generic reference cell 8.

At the same time, a cell current $I_{CELLA}$ is generated on the voltage follower branch, which is supplied by the set of transistors in cell 4.

When the transistor 13 reaches 1 volt, the transistor 14 switches off and the node 15, which is $V_{set}$, follows from below the dynamics of $V_{mod}$. That is, $V_{set}=V_{mod}-V_{TH}$, the threshold voltage of transistor 1. Therefore $V_{set}$ modulates the conductivity of the transistor 2, which in turn controls $V_{DIS}$.

The transistor 2 approaches its threshold, but the node 16, which is $V_{DIS}$, remains low because the transistor 2 is unable to deliver the set reference current $I_{REF}$.

As $V_{mod}$ decreases, the conductivity of the transistor 2 increases, and so does $V_{DIS}$, and increasingly approaches the current value of $I_{REF}$.

When the conductivity of the transistor 2 reaches a current level that is set with the ratio between the cell current and the reference current, $V_{DIS}$ gradually increases until it reaches the activation threshold of the transistor 11, which is 1 volt.

The transistor 11 is therefore activated exactly when the ratio between the cell current and the reference current is greater than 1. In this manner, the voltage $V_{DIS}$ drives the switching-on of the transistor 11, which is responsible for the fast discharge of $V_{mod}$ and therefore for the steeper slope part of $V_{mod}$ indicated at time period 22 in FIG. 2c.

At this point, therefore, the progression becomes very fast: $V_{mod}$ drops to ground, $V_{set}$ quickly degrades to ground, and $V_{dis}$ rises quickly to $V_{DD}$, and the initial inactive condition is regained.

In this manner, the signal $V_{mod}$ has a behavior including two slopes: a less steep one, which permits evaluation of the datum with appropriate caution, and a much steeper slope, which occurs at the end of reliable evaluation, to capture the datum and store it.

It should be noted that the second slope, i.e., the steeper part of $V_{mod}$, is triggered only when the equalization signal $V_{mod}$, by virtue of its slow decrease, has reduced the equalization action on the latch to the point that the current produced on the transistor 2 is greater than the reference current set externally to the circuit by means of the first voltage source. Therefore, switching to the steeply sloping of $V_{mod}$ part can be linked to a reference current, which in turn is a function of the conductivity of the cell.

Therefore if a cell is highly conductive, the cell current is high and therefore the ratio between the cell current and the reference current reaches and exceeds 1 much faster than would occur if the cell were scarcely conductive and the cell current were small. In this regard, the operating context in which the cell is used, that is to say, the voltage values used, is also important.

This effect is clearly visible in the chart of FIG. 3, where the dashed lines indicate the variations that the curves of $V_{set}$ and $V_{mod}$ assume in case of a large number of transistors 5 in the cell 8, i.e., if "m" is large and "n" is also large.

Therefore, the slope of $V_{mod}$ is controlled by means of "m" and the separation of $V_{set}$ from $V_{mod}$ is instead controlled by means of "n." In practice, one determines the instant when triggering must occur, that is to say, when the quick change in slope after the datum evaluation step must occur.

In practice it has been observed that the circuit of the embodiment shown in FIG. 2a passes very gradually from the equalization (inactive) step to the evaluation step, providing maximum circuit sensitivity so that the datum is sensed reliably. Furthermore, the capacitive noise (Miller effect) associated with the switching of the equalization line during the creation of the signal $V_{mod}$ is reduced.

Another advantage of this circuit is that it is possible to drastically reduce the datum evaluation time, allowing faster capture.

Transition from the slow step (shallow slope) to the fast step (steep slope) is achieved by means of a circuit that permits quantization of the signal produced therein and permits changing of the slope in certain datum acquisition conditions and, at the same time, in the shortest possible time interval.

The timing for the creation of the signal $V_{mod}$ thus becomes dependent on the conductivity of a given base cell, linking the operating dynamics to the actual geometric features of the cell and to the voltages being used.

Having thus described several particular embodiments of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. For example, the signal $V_{mod}$ obtained as described above can be used to directly drive a latch amplifier. Additionally, the specific circuit elements and arrangements may be replaced with other technically equivalent elements that perform the same functions. In practice, the materials employed, so long as they are compatible with the specific use as well as desired dimensions, may be selected according to the requirements of a particular design and the state of the art. Accordingly, the foregoing description is by way of example only and is not intended to be limiting. The invention is limited only as defined in the following claims and equivalents thereto.

What is claimed is:

1. A circuit for generating an equalization signal with a modulated slope for a latch arrangement having an input for receiving the equalization signal on an equalization line and a load, the circuit comprising:
   a current follower branch having a generic matrix cell connected to the load of the latch arrangement and for following a current of the generic matrix cell;
   a current ratio evaluation branch connected to the current follower branch for evaluating a ratio between the current and a reference current;
   a slow discharge branch, having an input for receiving a control signal having a first state for precharging the circuit and a second state for discharging the circuit, connected to the equalization line and for slowly discharging the equalization line at a first slope after a change of the control signal from the first state to the second state; and
   a fast discharge branch connected to the equalization line for quickly discharging the equalization line at a second slope;
   wherein the current ratio evaluation branch activates the fast discharge branch in response to the evaluated ratio.

2. The circuit of claim 1, further comprising a capacitor connected between the equalization line and ground in parallel with the slow discharge branch.

3. The circuit of claim 1, further comprising one or more mirroring transistors, having drain terminals connected to the current ratio evaluation branch, source terminals and gate terminals supplied by a voltage source, for generating the reference current.

4. The circuit of claim 3, wherein the source terminals of the one or more mirroring transistors are connected to ground.

5. The circuit of claim 3, wherein the latch arrangement comprises:
   a first transistor having a source terminal, a gate terminal connected to the equalization line and a drain terminal connected to a supply voltage; and
   a second transistor having a gate terminal connected to the source terminal of the first transistor, a drain terminal connected to a supply voltage and a source terminal.

6. The circuit of claim 5, wherein the current ratio evaluation branch comprises:
   a third transistor having a drain terminal connected to the source terminal of the second transistor, and a source terminal connected to the drain terminals of the one or more mirroring transistors.

7. The circuit of claim 6, wherein the second transistor has a first polarity and the third transistor has a second polarity.

8. The circuit of claim 6, wherein the fast discharge branch comprises:
   a fourth transistor of a second polarity having a drain terminal connected to the equalization line, a source terminal connected to ground, and a gate terminal connected to the source terminal of the second transistor and the drain terminal of the third transistor.

9. The circuit of claim 1, further comprising one or more mirroring transistors, having drain terminals connected to the slow discharge branch, source terminals and gate terminals supplied by a voltage source to set a current that is a function of the conductivity of the generic matrix cell, and for controlling the first slope.

10. The circuit of claim 9, wherein the source terminals of the one or more mirroring transistors are connected to ground.

11. The circuit of claim 9, wherein the slow discharge branch comprises:
    a first transistor having a source terminal, a drain terminal connected to a supply voltage and a gate terminal connected to receive the control signal;
    a second transistor having a source terminal connected to the drain terminals of the one or more mirroring transistors, a drain terminal connected to the source terminal of the first transistor and a gate terminal connected to receive the control signal.

12. The circuit of claim 11, wherein the first transistor has a first polarity and the second transistor has a second polarity.

13. The circuit of claim 1, wherein the generic matrix cell comprises one or more mirroring transistors, having drain terminals connected to the load of the latch arrangement, source terminals and gate terminals supplied by a voltage source, for controlling ability of the current follower branch to follow the current of the generic matrix cell.

14. The circuit of claim 13, wherein the source terminals of the one or more mirroring transistors are connected to ground.

15. The circuit of claim 13, wherein the current follower branch comprises:

a first transistor having a source terminal connected to the drain terminals of the one or more mirroring transistors, a gate terminal connected to receive the control signal, and a drain terminal; and an second transistor having a drain terminal connected to a supply voltage, a gate terminal connected to the gate terminal of the first transistor and a source terminal connected to the drain terminal of the seventh transistor.

16. The circuit of claim 15, wherein the second transistor has a first polarity and the first transistor has a second polarity.

17. A memory device, comprising:

a latch arrangement having an input for receiving an equalization signal on an equalization line and a load;

a current follower branch having a generic matrix cell connected to the load of the latch arrangement and for following a current of the generic matrix cell;

a current ratio evaluation branch connected to the current follower branch for evaluating a ratio between the current and a reference current;

a slow discharge branch, having an input for receiving a control signal having a first state for precharging the circuit and a second state for discharging the circuit, connected to the equalization line and for slowly discharging the equalization line at a first slope after a change of the control signal from the first state to the second state; and a fast discharge branch connected to the equalization line for quickly discharging the equalization line at a second slope;

wherein the current ratio evaluation branch activates the fast discharge branch in response to the evaluated ratio.

18. A process for modulating a slope of an equalization signal applied to a latch arrangement having an input for receiving the equalization signal and a load, the process comprising the steps of:

presetting the equalization signal to a first value;

initiating a change in the equalization signal from the first value to a second value;

slowly discharging the equalization signal at a first slope;

evaluating a ratio between a current generated in a generic matrix cell applied to the load of the latch arrangement and a reference current; and when the evaluated ratio reaches a desired level, quickly discharging the equalization signal to the second value at a second slope.

19. A circuit for modulating a slope of an equalization signal applied to a latch arrangement having an input for receiving the equalization signal and a load, the circuit comprising:

means for presetting the equalization signal to a first value;

means for receiving a control signal to initiate a change in the equalization signal from the first value to a second value;

means for slowly discharging the equalization signal at a first slope;

means for evaluating a ratio between a current generated in a generic matrix cell applied to the load of the latch arrangement and a reference current; and means, operative when the evaluated ratio reaches a desired level, for quickly discharging the equalization signal to the second value at a second slope.

* * * * *